United States Patent [19]

Tanaka

[11] Patent Number: 5,151,040
[45] Date of Patent: Sep. 29, 1992

[54] ELECTRICAL CONNECTOR FOR REPEATED CONNECTION TO INTEGRATED CIRCUIT GRID ARRAY DEVICES

[75] Inventor: Mitsuho Tanaka, Tama, Japan
[73] Assignee: Kel Corporation, Tokyo, Japan
[21] Appl. No.: 693,231
[22] Filed: Apr. 26, 1991

[30] Foreign Application Priority Data

Apr. 27, 1990 [JP] Japan ................. 2-112769

[51] Int. Cl.⁵ ............................. H05K 1/00
[52] U.S. Cl. ..................... 439/73; 439/700; 439/824
[58] Field of Search .......... 439/824, 700, 816-821, 439/70-73, 330, 331, 482

[56] References Cited

U.S. PATENT DOCUMENTS

| | | | |
|---|---|---|---|
| 1,567,474 | 12/1925 | Tomlinson | 439/700 |
| 3,416,125 | 12/1968 | Theve | 439/700 |
| 4,358,175 | 11/1982 | Reid | 439/700 |
| 4,397,519 | 8/1983 | Cooney | 439/824 |
| 4,743,201 | 5/1988 | Robinson et al. | 439/824 |

FOREIGN PATENT DOCUMENTS 2038745  7/1980  United Kingdom ............ 439/824

*Primary Examiner*—David L. Pirlot
*Attorney, Agent, or Firm*—Robert W. J. Usher

[57] ABSTRACT

A connector for an LGA IC device or a PGA IC device comprises an array of terminals in a housing each with a receptacle portion receiving a contact member mounted on the upper end of an axially extending compression spring for tilting movement into engagement with the receptacle wall at two, axially spaced locations by engagement with a pin or land depressing the spring. The contact member may be retained within the receptacle providing a socket for a pin of a PGA IC device or formed as a pin protruding from the free end of the receptacle for engagement with a land of an LGA IC device, in both cases providing a force assisting disconnection of the device.

16 Claims, 7 Drawing Sheets

(a)

(b)

(a)

(b)

ELECTRICAL CONNECTOR FOR REPEATED CONNECTION TO INTEGRATED CIRCUIT GRID ARRAY DEVICES

FIELD OF THE INVENTION

The invention relates to an electrical connector for repeated connection, usually for test purposes, to integrated circuit devices of the kind having an array of individual contacts on a contact face thereof. Such contacts may be pins of a pin grid array (PGA IC) or lands of a land grid array (LGA IC).

BACKGROUND OF THE DESCRIPTION

As described in more detail below, in one conventional type of test socket connector for a PGA IC device, an array of terminals are anchored in an insulating body. Each terminal has a cylindrical receptacle portion for receiving a lead of the device and contact pressure therewith is obtained by a ring of spring contact arms in the receptacles which extend away from the mouth in convergent, circumferentially spaced relation and have hardened free edge portions on free ends which grip an inserted lead, with resilient flexure apart of the arms.

However, disadvantages of such prior structure are that undesirably high insertion and withdrawal forces are necessary to overcome the frictional forces arising from the engagement of the spring arms, necessitated by reliance on laterally applied spring force for electrical contact pressure. Such withdrawal forces are all the more significant in a large grid array, often requiring use of a special extraction tool with possible risk of damage to the device.

Furthermore, variations in diameters or widths of leads result in an undesirable variation in contact force and poor contact reliability. Undesirable variations, with risk of spring strain and permanent damage can also arise from poor misalignment between the leads and spring arms arising from mating when misaligned.

SUMMARY OF THE INVENTION

It is an object of the invention to provide a connector for repeated connection to LGA IC or PGA IC devices in which the extraction force is eliminated and the connection is of improved reliability.

Accordingly, to one aspect of the invention there is provided an electrical connector for repeated connection to integrated circuit devices of the kind having an array of individual contacts on a contact face thereof, and comprising: an insulating housing body having an upper, contact face and a lower face for connection to an external circuit; a corresponding array of individual terminals anchored in the housing and each comprising a tubular receptacle portion having a mouth at the contact face and an integral male terminal portion extending axially therefrom and protruding from the lower face; a contact member mounted in each receptacle portion for axial sliding movement therein towards and away from the mouth; and, springs in respective receptacle portions in biassing engagement with the respective contact members to urge the contact members axially upwardly towards the contact face so that engagement of respective contacts with upper ends of respective contact members with an axial downward contact force depresses the respective contact members against the action of the spring axially further into the receptacle to establish electrical connection therebetween, and, disengagement of the contacts and contact members permits the spring to restore the respective contact members towards the upper face.

As reliance is placed on axial spring pressures normal to the contacting areas, contact pressure is independent of lead width or, within limits, lead alignment and the effect of frictional forces between the spring and the contacts is obviated.

Preferably, each contact member comprises a metal cap having a tapered contact end and a spring engaging end formed with spring locating means.

The cap may be mounted on the spring for tilting, relative to the receptacle axis, into engagement with opposite sides of the side wall of the receptacle on engagement by the contacts leads of the device providing two distinct, spaced apart contact points between the cap and the side wall. Desirably, each socket has a cylindrical side wall extending downwardly from the periphery of a end wall, the outer surface of which side wall has a generally convex axial cross-section, accommodating the tilting movement.

The accommodation of a degree of tilt of the male contact member may assist in assuring that insertion and withdrawal forces are minimized by accommodating variations arising from manufacturing tolerances while providing a distinct line or points of contact, further assuring reliability of connection.

In an alternative version, for LGA IC devices, the contact member cap comprises a metal pin extending axially into the receptacle and having a tapered axial contact end protruding from the contact face of the housing when in a disengaged condition for connection to a land or pad of the device.

Advantageously, each socket has an upper end wall providing a radially outwardly extending peripheral shoulder and collet means are provided in each receptacle adjacent the mouth, engageable with the shoulder to limit upward axial movement of the contact member thereby retaining the contact member in the receptacle.

This provides a compact and reliable assembly, economical to manufacture.

BRIEF DESCRIPTION OF THE DRAWINGS

Specific embodiments of the invention will now be described by way of example only with reference to the accompanying drawings in which.

Figure 6:
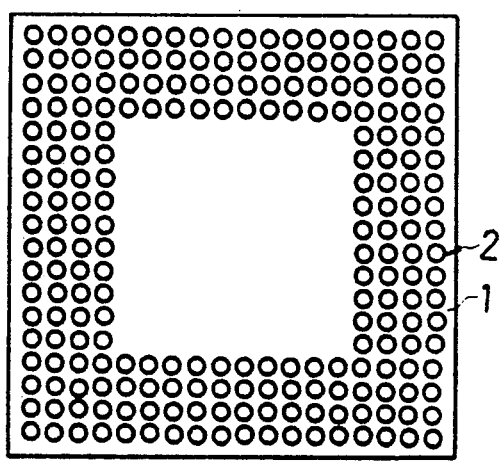
FIG. 6(a) and (b) is a plan and elevational view, respectively, of a prior PGA IC device socket connector.
Figure 6:
Figure 7A:
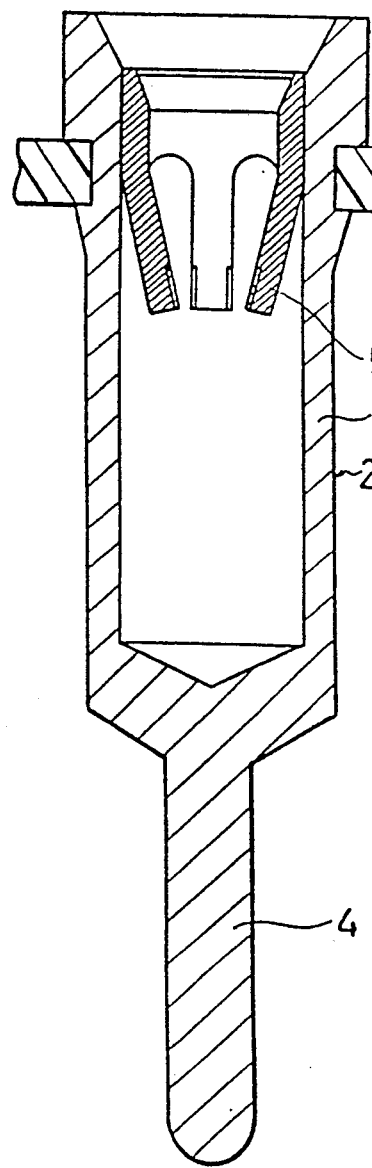
FIG. 7(a) and (b) is an axial cross-sectional view of a terminal of the prior PGA IC socket connector before and after lead insertion, respectively; and, FIG. 8 is an axial cross-sectional view of a terminal of a second example of LGA IC device connector according to the invention.
Figure 7B:
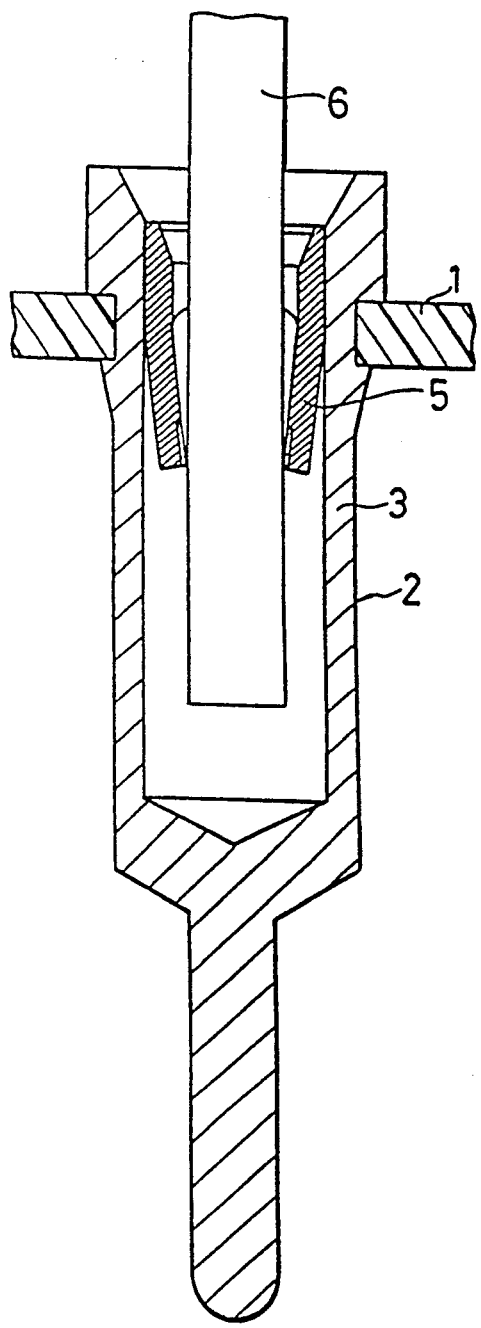

In one conventional type of test socket connector for a PGA IC device shown in FIGS. 6 and 7, an array of terminals 2 are anchored in an insulating body 1. Each terminal 2 has a cylindrical receptacle portion 3 for receiving a lead 6 of the device and contact pressure therewith is obtained by a annular spring having a cylindrical body mounted in the socket adjacent the mouth from which body a ring of spring contact arms 5 extend away from the mouth in convergent, circumferentially spaced relation. An inserted lead 6 will be gripped by hardened free edge portions of the free ends of the spring arms 5 with resilient flexure apart of the arms 5.

In the first embodiment of connector, shown in FIGS. 1-5, the insulating housing body 1 has upper and lower, contact and external connection faces, respectively, and an array of individual terminals 7 anchored therein.

Each terminal 7 comprises a one-piece cylindrical receptacle portion 9 having a mouth opening at the contact face and an integral male terminal portion 12 extending axially therefrom and protruding from the lower face. The lower, blind end of the receptacle portion 9 is formed with a coaxial recess centered on the receptacle axis and an helical coil, compression spring 13 seats on the recess and extends coaxially up the receptacle. A contact member 10 comprises a metal cap having an upper convex or conical contact surface and a lower, downwardly opening spring locating socket which receives the upper axial end of the conversion spring 13. The spring locating socket has a cylindrical wall surface which is convex in axial cross-section, permitting a degree of tilt of the cap on engagement with a contact lead. The cap 10 and spring 13 are retained assembled in the receptacle portion 9 by a collet 11 attached to the mouth thereof.

As shown particularly in FIG. 3(a), prior to insertion of a pin or lead into the socket, the cap 10 is held, extending in coaxial balance, against the lower end of the collet 11 by the spring 13 in a minimally compressed condition. On initial depression by engagement with a pin 6, as shown in FIG. 3(b), the cap becomes unbalanced and is tilted or inclined to the receptacle axis bringing two axially spaced apart locations of the convex outer surface into engagement with the receptacle wall.

As seen in cross-section in FIG. 3(c), the asymmetrically applied forces produce a contact force between the cap and the receptacle portion wall which force increases with depression of the spring and, in addition, a desirable wiping or self-cleaning action during further depression of the spring to final contact position.

Figure 1:
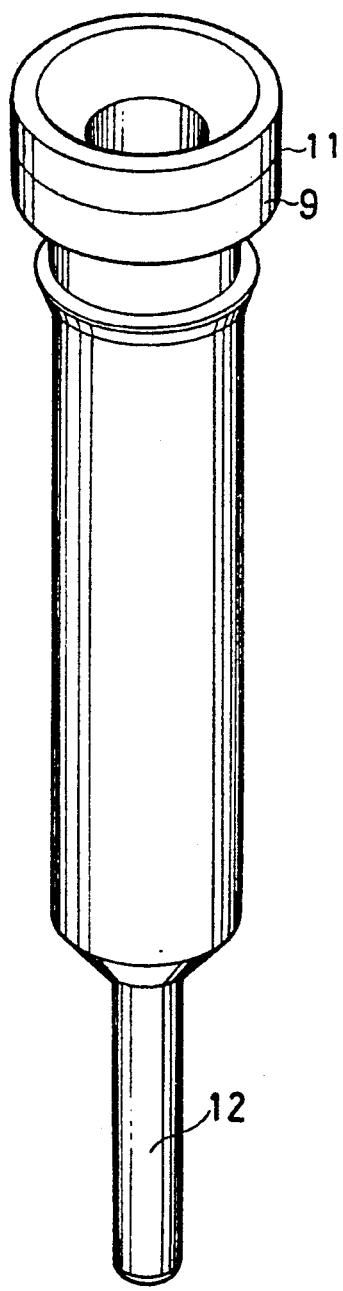
FIG. 1 is a perspective view of a terminal of a connector according to a first example of the invention.
Figure 2:
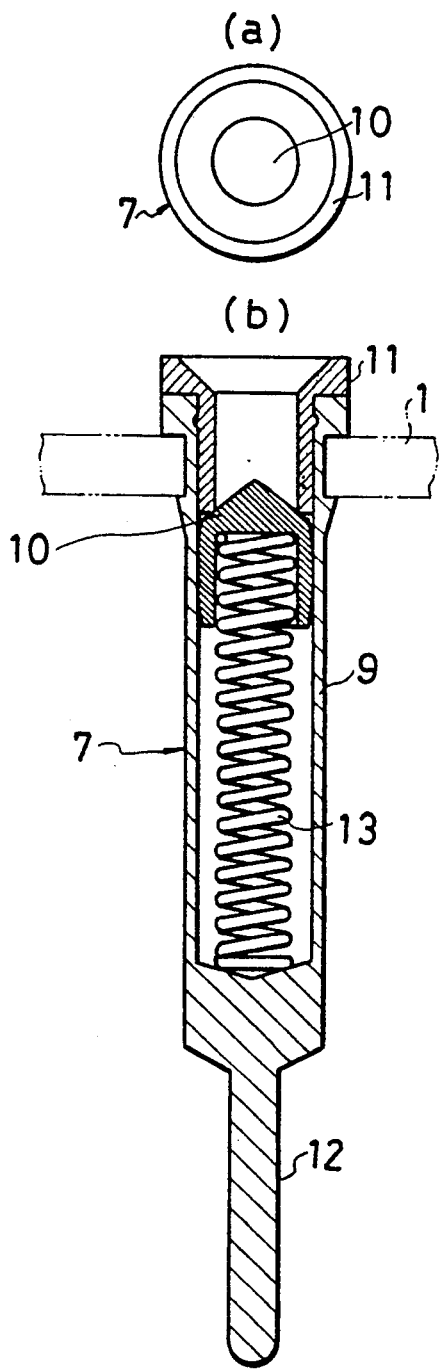
FIG. 2(a) and (b) is a plan and an axial cross-sectional view of the terminal of FIG. 1, respectively.
Figure 3:
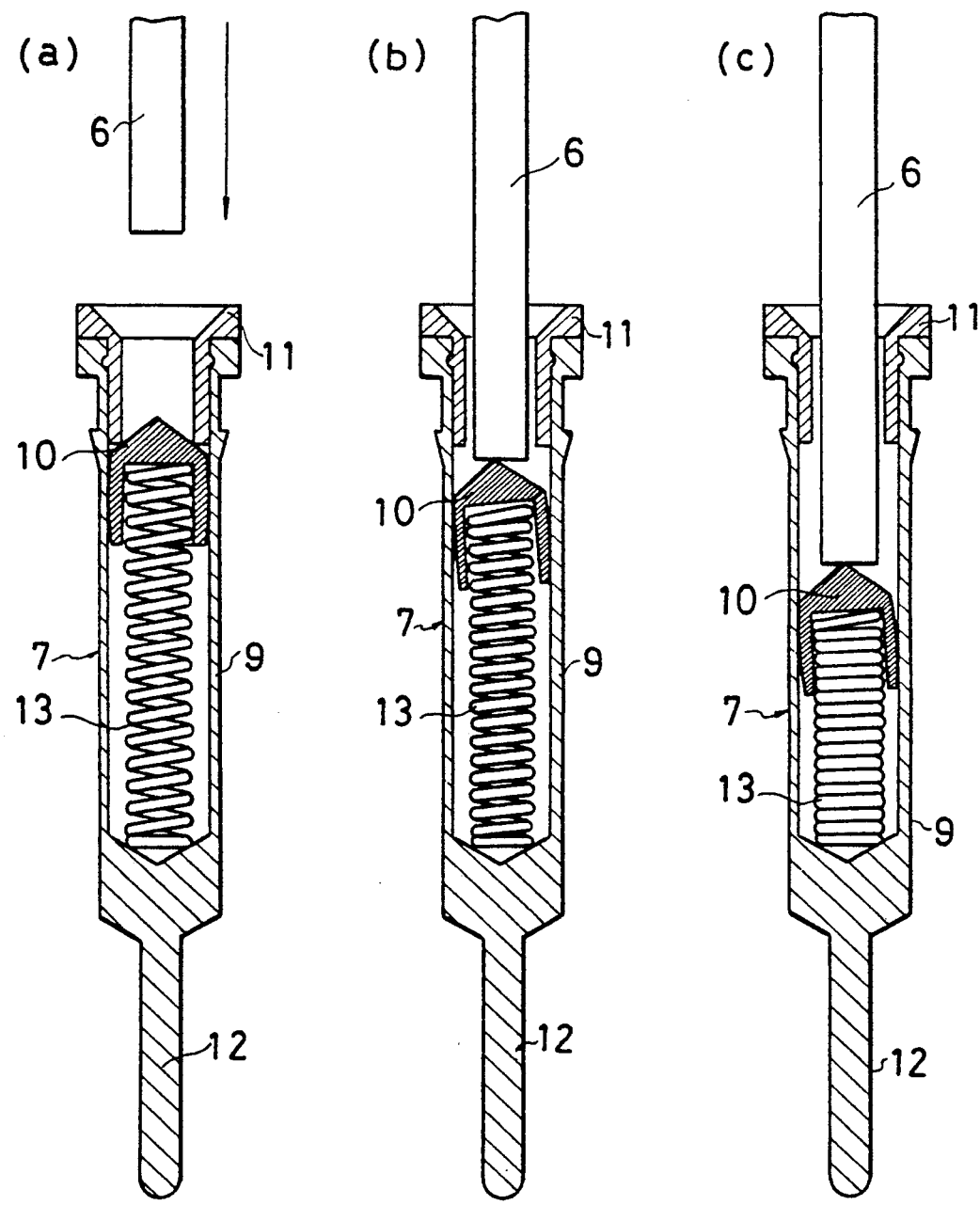
FIG. 3(a), (b) and (c) is a cross-sectional view similar to that of FIG. 2(b) at successive stages of lead insertion.
Figure 4:
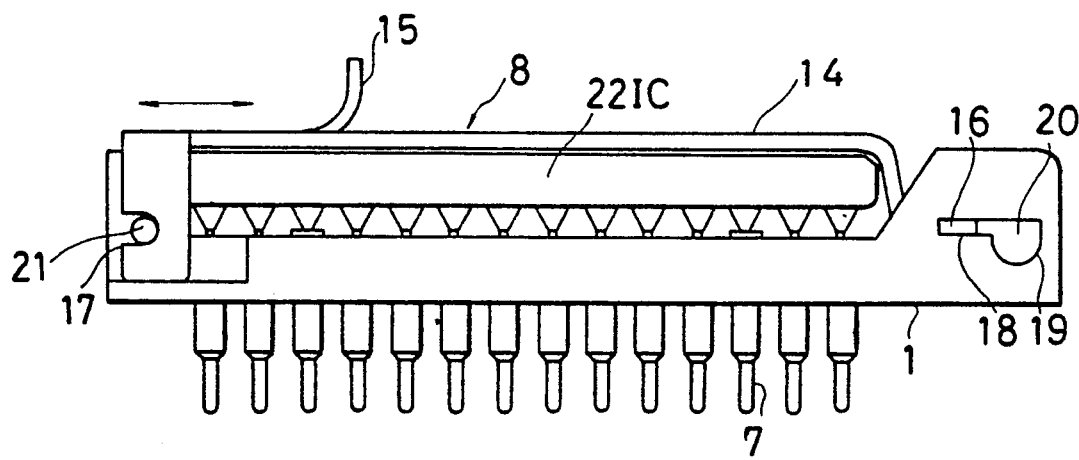
FIG. 4 is an elevational view of the first example of the connector with a PGA IC device mounted therein.
Figure 5:
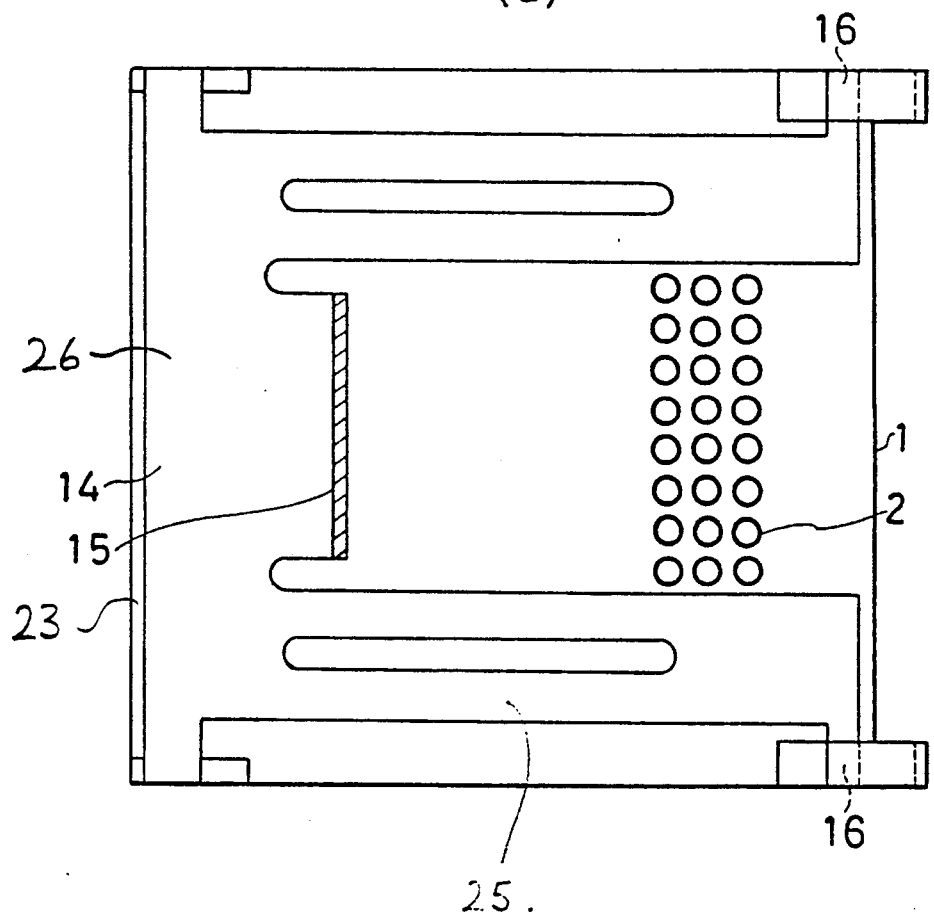
FIG. 5(a) and (b) is a plan and side elevational view of the connector, respectively.
Figure 5:
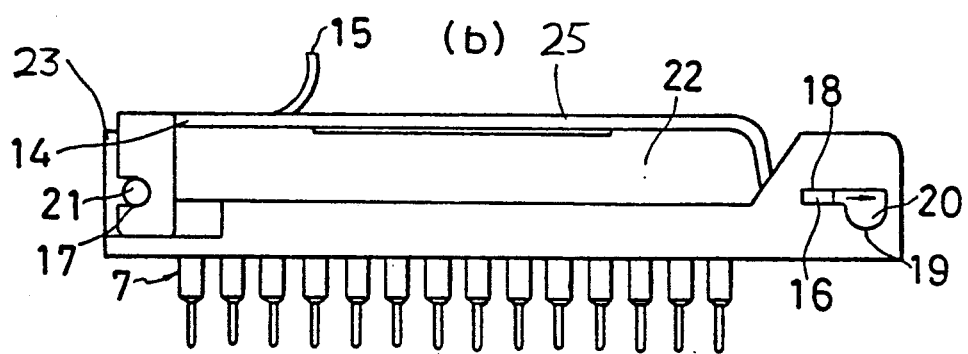

As shown in FIGS. 4 and 5, the housing body 11 is integrally formed with an end wall 23 upstanding along a front end edge thereof. A cover locating recess is formed in the body at respective opposite ends of the end wall and locking pins 21 extend laterally from respective opposite ends of the end wall into the recess. A pair of identical lugs or ears 19 protrude upwardly and rearwardly from opposite sides of the other end of the housing body and are formed with cover locating apertures 20 having horizontally extending slot-form portions 18 communicating rearwardly with semicircular pivot portions 20.

The cover member is integrally formed, preferably stamped and formed from a sheet metal stock, in a generally U-shape, in plan, comprising a pair of stifly resiliently flexible arm-like wall parts 25 which extend rearwardly in spaced apart coplanar relation from respective opposite ends of a transverse, front end wall part 26, opposite ends having lateral extensions of reduced width from which depend respective flanges having forwardly opening pin receiving, locking slots 27. Depressed rear ends of the arm-like wall parts have laterally outwardly extending pivot tabs 16. A finger-piece 15 upstands from the rear edge of the end wall.

To assemble the cover member with the base, rear ends of the arm-like wall parts 25 are squeezed towards each other and the tabs 16 then inserted into the semicircular slots, the resiling action of the arm-like wall parts 25 securing the tabs therein. The cover is then moved forwardly with the depending flanges received in the recesses, moving the locking slots 17 and tabs 16 thereof into locking engagement with the pins 21 and the slots 18 of the housing body, respectively.

It will be appreciated, therefore, that forward sliding movement of the cover releases the locking pin 21 from the locking slot 17 and causes the locking tab 16 to enter the enlarged pivotal portion of the aperture permitting the front to be raised, clam-shell fashion, to enable a PGA IC device to be plugged into the contact face of the housing body 1. Subsequent pivotal movement of the cover to a closed position and forward sliding movement secures the PGA IC device in the housing seated between the end wall 23 and the depressed rear ends of the arms 25. Release of the PGA IC device is obtained by the reverse operation.

Figure 8:
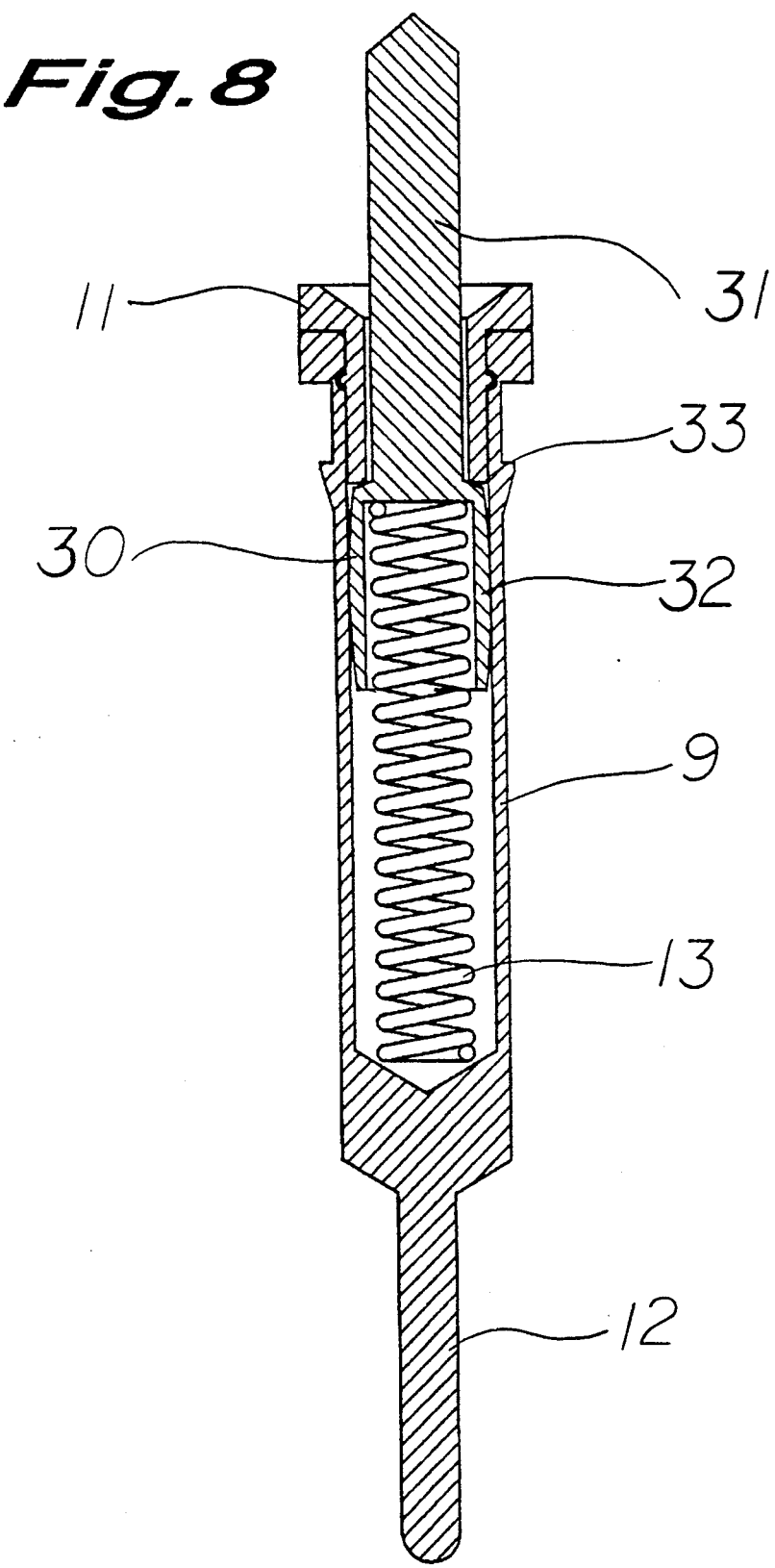

In the second embodiment, shown in FIG. 8, in which primed reference numerals indicate components similar to those of the first example, the cap 30 has a contact portion 31 of extended length having a pin which is biassed to extend out of the receptacle mouth, upstanding from the contact face for connection to a land of an LGA IC device. Depression of the pin 31 into the receptacle by engagement with the land produces a similar tilting effect to that of the first embodiment. A base wall of spring locating socket portions 32 of the cap is of increased diameter providing a retentin shoulder 33 engaging the collet 11' in the uppermost position of the cap 30 thereby trapping the assembly of the contact member and spring in the receptacle.

What is claimed is:

1. An electrical connector for repeated connection to integrated circuit devices of the kind having an array of individual contacts on a contact face thereof, and comprising:

an insulating housing body having an upper, contact face and a lower face for connection to an external circuit;

a corresponding array of individual terminals anchored in the housing and each comprising a tubular receptacle portion having a mouth at the contact face and a male terminal portion extending axially therefrom and protruding from the lower face;

a contact member mounted in each receptacle portion for axial sliding movement therein towards and away from the mouth;

springs in respective receptacle portions in biassing engagement with the respective contact members to urge the contact members axially upwardly towards the contact face so that engagement of respective contacts with upper ends of respective members with an axial downward contact force depresses the respective contact members against the action of the spring axially further into the receptacle to establish electrical connection therebetween, and, disengagement, of the contacts and contact members permits the spring to restore the respective contact members towards the upper face;

the housing body being molded from one piece of plastic material with front and rear ends and opposite sides extending between the ends, locking projections extending laterally from opposite sides at the front end and ears upstanding from opposite sides at the rear end, identical apertures being formed in respective ears, each aperture having an enlarged pivotal portion communicating forwardly with a slot-form locking portion; and a one-piece cover member of generally U-shape having a pair of resilient arms extending rearwardly from a forward transverse wall, flanges depending from opposite ends of the transverse wall and having forwardly opening locking pin receiving slots, forward, free ends of the arms having depending portions and tabs extending laterally outwardly therefrom, the cover member being mountable on the housing body by receipt of the respective tabs in respective enlarged portions of respective apertures, admitted therein by resilient flexure together of the free ends of the arms and the cover member being moveable between open, device receiving, and closed, device retaining, positions, by pivotal movement of the front end between positions remote and adjacent the contact face, respectively, and subsequent forward movement of the cover member to bring the locking slots into registration with respective locking pins and the tabs into registration with the locking slots of the base member.

2. An electrical connector according to claim 1 in which the male terminal portion is integrally formed with the sleeve.

3. An electrical connector according to claim 1 in which each contact member comprises a metal cap having an upwardly convex contact end and a spring engaging end formed with spring locating means.

4. An electrical connector according to claim 1 in which the contact member comprises a metal pin extending axially into the receptacle and having a tapered axial contact end protruding from the contact face of the housing when in a disengaged condition for connection to a land grid array device.

5. An electrical connector according to claim 4 in which the spring comprises an helical coil spring extending coaxially within the receptacle and the opposite axial end of the contact member comprises a socket receiving and locating an upper axial end of the spring.

6. An electrical connector according to claim 1 in which collet means are provided in each receptacle adjacent the mouth for engagement with a respective contact member to limit upward axial movement thereof, thereby, retaining the contact member within the receptacle and constituting a female contact for receipt of a pin of a pin grid array device.

7. An electrical connector according to claim 6 in which each socket has an upper end wall providing a radially outwardly extending peripheral shoulder and collet means are provided in each receptacle adjacent the mouth engageable with the shoulder to limit upward axial movement of the contact member thereby retaining the contact member in the receptacle.

8. An electrical connector according to claim 7 in which each socket has a cylindrical side wall extending downwardly from the periphery of the end wall, the outer surface of which side wall has a generally convex axial cross-section, the contact member being mounted on the spring for tilting movement relative to the axis of the receptacle portion by engagement with a contact to bring axially spaced surface portions into engagement with the inner surface of the receptacle.

9. An electrical connector according to claim 3 in which the spring comprises an helical coil spring extending coaxially within the receptacle and the locating means comprises a socket receiving internally an upper axial end of the spring.

10. An electrical connector according to claim 9 in which each socket has a cylindrical side wall extending downwardly from the periphery of the end wall, the outer surface of which side wall has a generally convex axial cross-section, the contact member being mounted on the spring for tilting movement relative to the axis of the receptacle portion by engagement with a contact to bring axially spaced surface portions into engagement with an inner surface of the receptacle.

11. An electrical connector for repeated connection to integrated circuit devices of the kind having an array of individual contacts on a contact face thereof, and comprising:

an insulating housing body having an upper, contact face and a lower face for connection to an external circuit;

a corresponding array of individual terminals anchored in the housing and each comprising a tubular receptacle portion having a mouth at the contact face and a male terminal portion integrally formed with the receptacle portion, extending axially therefrom and protruding from the lower face;

a contact member mounted in each receptacle portion for axial sliding movement therein towards and away from the mouth;

collet means provided in each receptacle adjacent the mouth for engagement with a respective contact member to limit upward axial movement thereof, thereby, retaining the contact member within the receptacle and constituting a female contact for receipt of a pin of a pin grid array device;

springs in respective receptacle portions in biassing engagement with the respective contact members to urge the contact members axially upwardly towards the contact face so that engagement of respective contacts with upper ends of respective contact members with an axial downward contact force depresses the respective contact members against the action of the springs axially further into the receptacle to establish electrical connection therebetween, and disengagement, of the contacts and contact members permits the springs to restore the respective contact members towards the upper face.

12. An electrical connector according to claim 11 in which each socket has an upper end wall providing a radially outwardly extending peripheral shoulder and collet means are provided in each receptacle adjacent the mouth engageable with the shoulder to limit upward axial movement of the contact member thereby retaining the contact member in the receptacle.

13. An electrical connector according to claim 12 in which each socket has a cylindrical side wall extending downwardly from the periphery of the end wall, the outer surface of which side wall has a generally convex axial cross-section, the contact member being mounted on the spring for tilting movement relative to the axis of the receptacle portion by engagement with a contact to bring axially spaced surface portions into engagement with the inner surface of the receptacle.

14. An electrical connector for repeated connection to integrated circuit devices of the kind having an array of individual contacts on a contact face thereof, and comprising:

an insulating housing body having an upper, contact face and a lower face for connection to an external circuit;

a corresponding array of individual terminals anchored in the housing and each comprising a tubular receptacle portion having a mouth at the contact face and a male terminal portion integral with the receptacle portion, extending axially therefrom and protruding from the lower face;

a contact member mounted in each receptacle portion for axial sliding movement therein towards and away from the mouth and comprising a metal cap having an upper contact end wall and a downwardly opening spring locating socket receiving an upper axial end of the spring, each socket having a cylindrical side wall extending downwardly from a periphery of the end wall, the outer surface of which side wall has a generally convex axial cross-section, helical coil springs extending coaxially in respective receptacle portions in biassing engagement with the respective contact members to urge the contact members axially upwardly towards the contact face so that engagement of respective contacts with upper ends of respective contact members with an axial downward contact force depresses the respective contact members against the action of the spring axially further into the receptacle to establish electrical connection therebetween, and, disengagement, of the contacts and contact members permits the spring to restore the respective contact members towards the upper face, the contact member being mounted on the spring for tilting movement relative to the axis of the receptacle portion by engagement with a contact to bring axially spaced surface portions into engagement with an inner surface of the receptacle.

15. An electrical connector according to claim 14 in which the contact end wall of the cap presents an upwardly convex contact surface.

16. An electrical connector for repeated connection to integrated circuit devices of the kind having an array of individual contacts on a contact face thereof, and comprising:

an insulating housing body having an upper, contact face and a lower face for connection to an external circuit;

a corresponding array of individual terminals anchored in the housing and each comprising a tubular receptacle portion having a mouth at the contact face and a male terminal portion integrally formed with the receptacle portion, extending axially therefrom and protruding from the lower face;

a contact member mounted in each receptacle portion for axial sliding movement therein towards and away from the mouth; and, collet means provided in each receptacle adjacent the mouth for engagement with a respective contact member to limit upward axial movement thereof, thereby, retaining the contact member within the receptacle; springs in respective receptacle portions in biassing engagement with the respective contact members to urge the contact members axially upwardly towards the contact face so that engagement of respective contacts with upper ends of respective contact members with an axial downward contact force depresses the respective contact members against the action of the springs axially further into the receptacle to establish electrical connection therebetween, and, disengagement, of the contacts and contact members permits the springs to restore the respective contact members towards the upper face.

* * * * *